United States Patent [19]

Ikeda

[11] Patent Number: 5,166,633
[45] Date of Patent: Nov. 24, 1992

[54] ANGLE MODULATION DECTECTOR
[75] Inventor: Masaharu Ikeda, Yokohama, Japan
[73] Assignee: Matsushita Electric Industrial Co., Ltd., Osaka, Japan
[21] Appl. No.: 796,597
[22] Filed: Nov. 22, 1991
[30] Foreign Application Priority Data
Nov. 28, 1990 [JP] Japan .................................. 2-332460
[51] Int. Cl.$^5$ ............................................. H03D 3/00
[52] U.S. Cl. ................................... 329/337; 329/321; 329/345
[58] Field of Search .............. 329/315, 318, 321, 327, 329/336, 337, 345

[56] References Cited
U.S. PATENT DOCUMENTS
3,667,060  5/1972  Avins .................... 329/337
3,702,442  11/1972  Janssen et al. .

FOREIGN PATENT DOCUMENTS
55-158733  12/1980  Japan .
56-56008   5/1981   Japan .
2033682    5/1980   United Kingdom .

Primary Examiner—Robert J. Pascal
Attorney, Agent, or Firm—Spencer, Frank & Schneider

[57] ABSTRACT

An angle modulation detector which prevents a demodulated output from being influenced by fluctuations in the amplitudes of signals generated from angle-modulated signal sources such as a phase-modulated signal and a frequency-modulated signal, even if the amplitude of a driving voltage applied to a connection between the bases of a pair of transistors constituting a phase detecting device is made larger in order to enhance the demodulation sensitivity and reduce noise produced during demodulation. As an example of a resolution, the angle modulation detector comprises two coupling devices, two current dividing devices coupled to generate a phase detecting output, a current dividing device coupled to generate a re-mixed output, and a phase detecting device, wherein the outputs of the two coupling devices are connected to the two current driving devices driven by the same signal, so that the respective input and output terminals are at the same voltage level, whereby two outputs thereof are not influenced by fluctuations in amplitudes of angle-modulated signals supplied to the coupling devices.

11 Claims, 6 Drawing Sheets

ANGLE MODULATION DECTECTOR

BACKGROUND OF THE INVENTION

1. Field of the Invention

The present invention relates to a quadrature detecting apparatus for demodulating an angle-modulated signal such as a phase-modulated signal and a frequency-modulated signal, which is adapted to prevent the phase of a demodulated signal from changing even if the amplitude of a balanced angle-modulated input signal is varied.

2. Description of the Prior Art

Conventionally, this type of quadrature detecting apparatus, as disclosed in U.S. Pat. No. 3,667,060 (hereinafter described in connection with FIG. 1), comprises a phase detecting means C (multiplying means), a phase shifting means 2, and first and second coupling means A and B for supplying the input terminals of the phase detecting means C and the phase shifting means 2 with angle-modulated signals, respectively, and is constructed such that when a frequency-modulated signal is demodulated, variations in the amplitude of the frequency-modulated signal will not badly affect the demodulated signal.

Specifically, since the first coupling means A has the phase relationship between input and output signals thereof changing in dependence on the amplitude of an input signal, due to the circuit configuration, an angle-modulated signal, when passing through the first coupling means A, is subjected to phase modulation in accordance with fluctuations in the amplitude thereof, which results in generating components other than the modulated signal in the demodulated signal. However, such a change in phase produced in the first coupling means A is cancelled by providing the second coupling means B constructed identically to the first coupling means A prior to the phase shifting means 2, thereby preventing the influence of fluctuations in amplitude of the frequency-modulated signal on the demodulated output signal.

FIG. 1 illustrates the configuration of a conventional balanced quadrature detecting apparatus. In FIG. 1, reference numeral 1 designates a semi-conductor integrated circuit which includes active elements constituting the quadrature detecting apparatus. Reference letter A designates a first coupling means which is composed of a pair of transistors 107, 108 and a current source 30. Reference letter B designates a second coupling means which is composed of a pair of transistors 101, 102 and the common current source 30. A transistor 603 is a common-base type connection.

Reference letter C designates a phase detecting means which is balanced by two pairs of transistors 109 and 110; 111 and 112. The commonly connected emitters of the respective pairs respectively serve as inputs to the phase detecting means C, while a base-to-base voltage of the respective pairs is used as a control input. Also, the sum of collector currents of the transistors 109, 111 and the sum of collector currents of the transistors 110, 112 are balanced phase detecting output currents.

Reference numeral 2 designates a phase shifting means wherein a frequency-modulated signal is supplied from a phase shift input terminal 6, then a phase proportional to the frequency-modulated signal generated by a resistor 31, inductors 3, 4 and a capacitor 5 is added to the frequency-modulated signal, and the resultant signal is outputted to a phase shift output terminal 7. Reference numeral 8 designates an alternate current ground terminal.

Reference numeral 25 designates a first voltage source, 26 a second voltage source which is set to generate a voltage value smaller than that of the first voltage source 25.

Reference numerals 27 and 28 designate balanced (push-pull type) frequency modulated signal sources which are mixed with a bias voltage source 29. Transistors 19, 21 and 23 constitute emitter followers together with current sources 20, 22 and 24. Pairs of transistors 13 and 14, 15 and 16, 17 and 18 respectively constitute a current mirror. Reference numeral 10 designates a demodulated signal output terminal which is connected with a resistor 11, a voltage source 12 and a capacitor 9 as loads.

The operation of the above-mentioned conventional apparatus will be next described. Referring to FIG. 1, the pairs of transistors 107 and 108; 101 and 102, respectively constituting the first and second coupling means A and B, have their respective emitters commonly connected to the current source 30. Between the bases of the respective pairs, the identical balanced frequency-modulated signal sources 27 and 28 and the bias voltage source 29 are connected so that the two pairs of transistors operate as two sets of amplitude limiting amplifiers. Respective collector currents of the transistors 107 and 108 forming a pair, which are balanced outputs of the amplitude limiting amplifier of the first coupling means A, respectively flow into the common emitters which serve as inputs to the pairs of transistors 109 and 110; 111 and 112 which constitute the phase detecting means C.

One of the collector currents of the transistors 101, 102 forming a pair, which are balanced outputs of the amplitude limiting amplifier of the second coupling means B, is supplied to the phase shift input terminal 6 of the phase shifting means 2 through the transistor 603 which is a common-base type connection, while the other one flows into the second voltage source 26. A signal delivered from the phase shift output terminal 7 through the emitter follower formed by the transistor 19 is connected to one of the base-to-base connections of the pairs of transistors 109 and 110; 111 and 112, while a direct current voltage at the alternate current ground terminal 8 is connected through the emitter follower formed by the transistor 21 to the other one of the base-to-base connections.

In the above-mentioned conventional example, when the amplitude of frequency modulation of the frequency-modulated signals generated from the signal sources 27, 28 are changed, two sets of balanced amplitude limited outputs generated from the two sets of amplitude limiting amplifiers respectively composed of the pairs of transistors 107 and 108; 101 and 102, which also constitute the first and second coupling means, also changes correspondingly. The respective balanced amplitude limited outputs change completely in the same manner. Then, the collector currents of the transistors 107 and 108 constituting the first coupling means A are inputted to the common emitters of the pairs of transistors 109 and 110; 111 and 112, respectively. Also, the collector current of the transistor 101, a component of the second coupling means B, is supplied to the phase shift input terminal 6 through the common-base type transistor 603, whereby an emitter voltage of the transistor 603 hardly changes since the transistor 603 is a common-base type connection.

The phase shifting means 2 adds a phase proportional to the amplitude of frequency modulation of a signal passing therethrough to an output signal, so that the phase of a signal at the phase shift output terminal 7 changes in proportion to the amplitude of frequency modulation of a signal supplied to the phase shift input terminal 6. Therefore, a balanced amplitude-limited output in phase with the signal at the phase shift input terminal 6 is connected to the input, so that balanced modulated output currents proportional to the amplitudes of frequency modulation of the frequency-modulated signals generated from sources 27, 28 are derived at outputs of the phase detecting means C, the control input of which is supplied with a signal at the phase shift output terminal 7 through the emitter follower of the transistor 19. Then, one of the demodulated output currents balanced by the three pairs of transistors 17 and 18; 13 and 14; 15 and 16 has its direction changed, whereby the demodulated output currents are eventually converted to a balanced demodulated signal current proportional to the amplitudes of frequency modulation of the frequency-modulated signals generated from the sources 27, 28 at the demodulated signal output terminal 10. The balanced demodulated signal current can be taken out as a demodulated signal voltage by the resistor 11, the voltage source 12 and the capacitor 9.

Even if the amplitudes of the frequency-modulated signals generated from the frequency-modulated signal sources 27, 28 change to cause fluctuations in the phase relationship between the input and output of the amplitude limiting amplifier composed of the pair of transistors 107 and 108 which also constitute the first coupling means A, the phase of the output from the amplitude limiting amplifier composed of the pair of transistors 101 and 102 also constituting the second coupling means B in a configuration substantially equal to the first coupling means A also fluctuates in a similar manner.

The fluctuation in phase between the input and the control input of the phase detecting means C is thus cancelled, which results in eliminating the phase fluctuations therebetween and accordingly preventing the demodulated output from being influenced by such fluctuations.

As described above, the conventional quadrature detecting apparatus can also prevent a demodulated output from being influenced by fluctuations in amplitude of frequency-modulated signals generated from signal sources.

However in the above-mentioned conventional quadrature detecting apparatus, if the amplitude of a driving voltage fed to the second input of the phase detecting means C is increased to make larger the amplitude of the control input supplied to the phase detecting means C, for the purpose of enhancing the modulation sensitivity and reducing noise possibly produced during demodulation, fluctuations in the input and output of the phase detecting means C caused by fluctuations in the amplitudes of the frequency-modulated signals generated by the frequency-modulated signal sources 27, 28 connected to the amplitude limiting amplifiers constituting the first and second coupling means A, B do not become equal to each other, whereby such fluctuations appear in a demodulated output.

More specifically, as long as the amplitudes of the base-to-base voltages in the phase detecting means C composed of the pairs of transistors 109 and 110; 111 and 112, respectively having their emitters commonly connected, are small, there are also small changes in the voltages at the respective common emitters due to changes in the amplitudes. However, if the amplitudes of the base-to-base voltages are made larger, changes in voltages at the common emitters also become larger, which results in largely changing the base-to-collector voltages of the pair of transistors 107 and 108 of the amplitude limiting amplifier also constituting the first coupling means A. On the other hand, the base-to-collector voltages of the pair of transistors 101 and 102 of the amplitude limiting amplifier also constituting the second coupling means B hardly change because of the circuit configuration.

Therefore, fluctuations in the amplitudes of signals generated from the frequency-modulated signal sources 27, 28 cause fluctuations in the amplitude of the base-to-base voltage, whereby the relative phases of the two sets of balanced amplitude limited outputs from the amplitude limiting amplifiers constituting the first and second coupling means A and B which are respectively composed of transistors so as not to present the same base-to-collector voltages are subjected to fluctuations, which results in failing to achieve the original object.

SUMMARY OF THE INVENTION

The present invention has been made to solve the above-mentioned problems of the conventional quadrature detecting apparatus, and its object is to provide an improved quadrature detecting apparatus which can prevent a demodulated output from fluctuating due to fluctuations in amplitude of signals generated from angle-modulated signal sources, such as a phase-modulated signal and a frequency-modulated signal, even if a driving voltage amplitude of a base-to-base voltage of a pair of transistors constituting a phase detecting means is made larger in order to enhance the demodulation sensitivity and reduce noise produced during demodulation.

To achieve the above object, a quadrature detecting apparatus according to the present invention comprises:

(1) Two coupling means, two current dividing means coupled to generate a phase detecting output, a current dividing means coupled to generate a re-mixed output, and a phase shifting means, for example, as shown in FIGS. 2 and 3.

(2) A coupling means coupled to generate divided outputs, two current dividing means coupled to generate a phase detecting output, a current dividing means coupled to generate a re-mixed output, and a phase shifting means, for example, as shown in FIG. 4.

(3) A coupling means, two current dividing means coupled to generate a phase detecting output, a current dividing means coupled to generate a re-mixed output, and a phase shifting means, for example, as shown in FIG. 5.

(4) a coupling means, a current dividing means having one output coupled to generate a phase detecting output and the other output coupled to generate a re-mixed output, and a phase shifting means, for example, as shown in FIG. 6.

Therefore, according to the present invention:

(1) The outputs of the respective two coupling means are connected to two current dividing means which are driven by the same signal, so that the respective input and output terminals are at the same voltage level. For this reason, even if the amplitudes of frequency-modulated signals inputted to the coupling means fluctuate, the two outputs of the current dividing means are the same, thereby producing an effect of preventing such fluctuations from appearing in a demodulated output.

(2) The outputs of the coupling means, since connected to two current dividing means which are driven by the same signal, present the same voltage. Therefore, since two divided outputs are the same even if the amplitudes of frequency-modulated signals supplied to the respective coupling means fluctuate, such fluctuations will not appear in a demodulated output.

(3) The outputs of the coupling means, since connected to two current dividing means which are driven by the same amplitude signal, present the same voltage. In this configuration, two output currents, since divided in a fixed division ratio, remain fixed even if the amplitudes of frequency-modulated signals supplied to the coupling means fluctuate, whereby such fluctuations will not appear in a demodulated output.

(4) The outputs of the coupling means are connected to the current dividing means driven by the same signal, and a phase detecting output and a re-mixed output are derived by a signal divided and further divided by the current dividing means. Therefore, the two outputs further divided by the current dividing means are the same even if the amplitudes of frequency-modulated signals supplied to the coupling mean fluctuate, whereby such fluctuations will not appear in a demodulated output.

DESCRIPTION OF THE PREFERRED EMBODIMENTS

Figure 1:
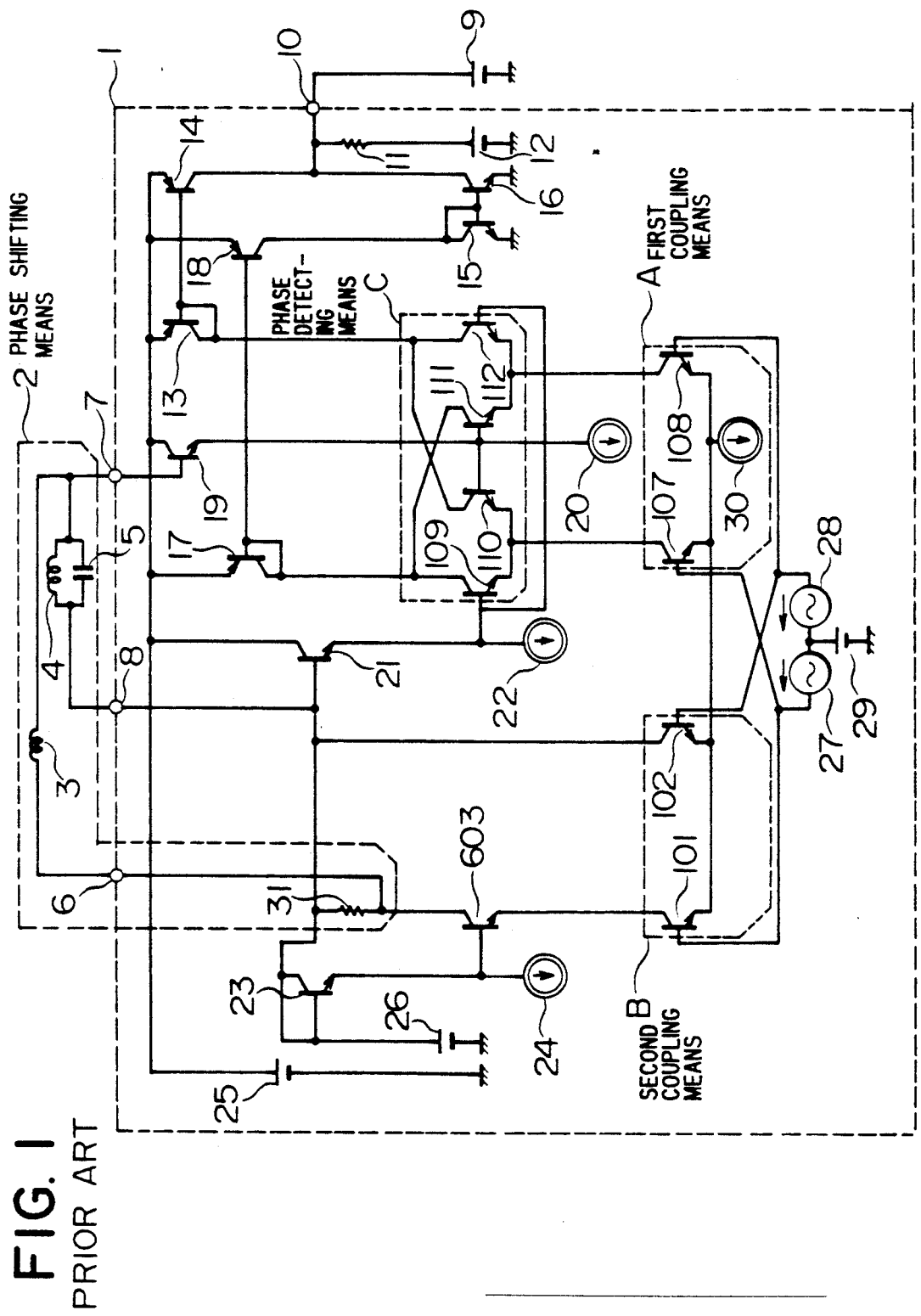
FIG. 1 is a schematic circuit diagram illustrating the configuration of a conventional quadrature detecting apparatus.
Figure 2:
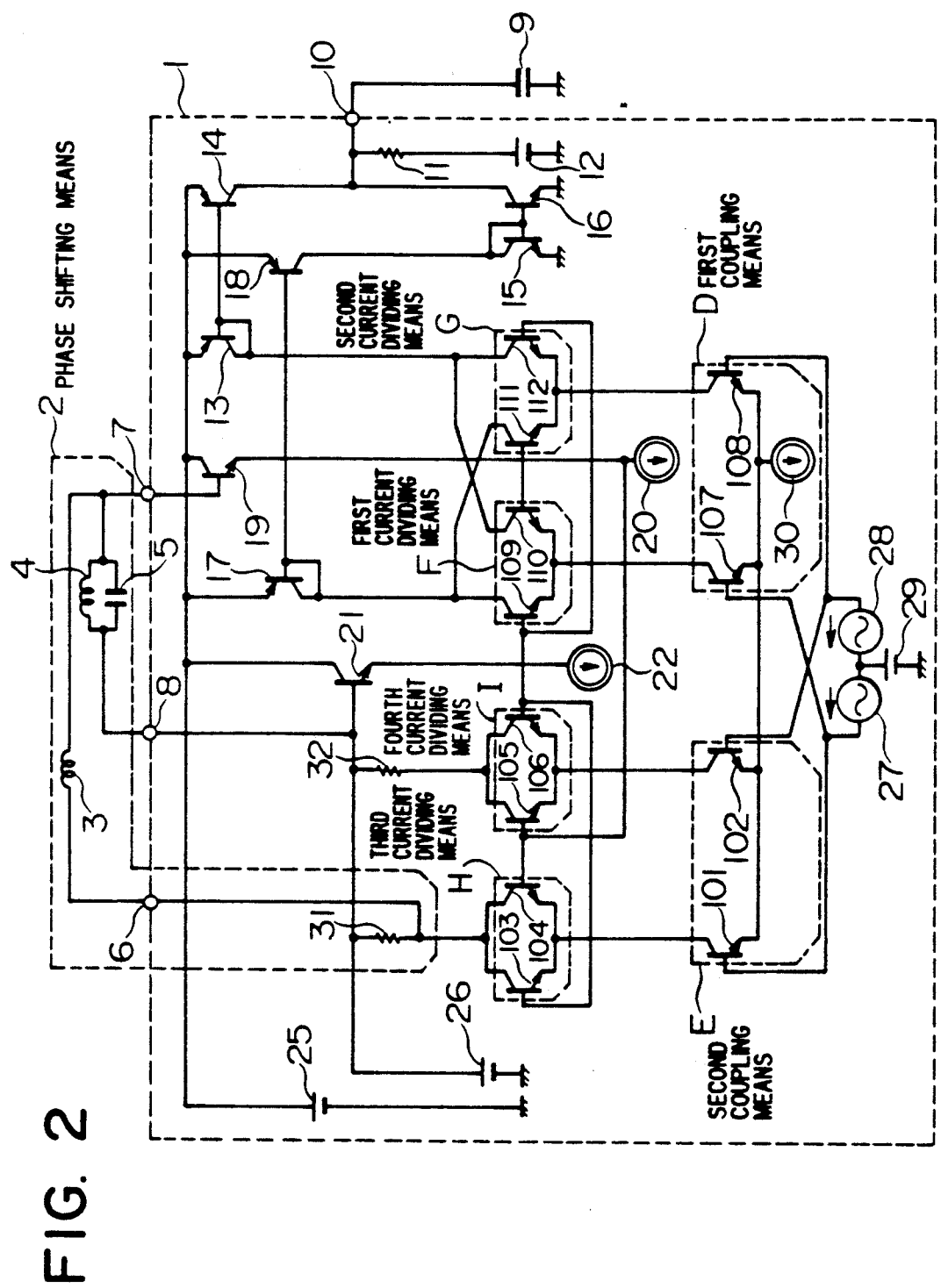
FIG. 2 is a schematic circuit diagram illustrating the configuration of a quadrature detecting apparatus according to a first embodiment of the present invention.

FIG. 2 illustrates the configuration of a first embodiment of the present invention. In FIG. 2, parts corresponding to those in FIG. 1 are designated by the same reference numerals.

In FIG. 2, reference numeral 1 designates a semiconductor integrated circuit which includes active elements of the quadrature detecting apparatus. Reference letter D designates a first coupling means which is composed of a pair of transistors 107, 108 and a current source 30. Reference letter E designates a second coupling means which is composed of a pair of transistors 101, 102 and the common current source 30.

Reference letter F designates a first current dividing means, composed of a pair of transistors 109 and 110 having the emitters thereof commonly connected, such that an input current flowing into the common emitter is controlled to be divided into two output currents flowing through the respective collectors in accordance with the magnitude of a base-to-base voltage which serves as a control input. Similarly, a second current dividing means G is composed of a pair of transistors 111 and 112, a third current dividing means I of a pair of transistors 105 and 106, and a fourth current dividing means H of a pair of transistors 103 and 104, and these current dividing means operate in a manner similar to the first current dividing means F. Reference numeral 25 designates a first voltage source, and 26 a second voltage source which is set to a smaller voltage value than the first voltage source 25. Reference numeral 30 designates a current source, and 27, 28 balanced frequency-modulated signal sources which are mixed with a bias voltage source 29. Reference numeral 2 designates a phase shifting means which receives a frequency-modulated signal supplied from a phase shift input terminal 6, adds a phase proportional to a frequency modulation degree of the received signal, produced by a resistor 31, inductors 3, 4 and a capacitor 5, to the frequency-modulated signal, and outputs the resultant signal to a phase shift output terminal 7. Reference numeral 8 designates an alternate current ground terminal. Transistors 19 and 21 form emitter followers together with current sources 20 and 22, respectively. Three pairs of transistors 13 and 14; 15 and 16; 17 and 18 respectively form a current mirror structure. Reference numeral 10 designates a demodulated signal output terminal which is connected to a resistor 11, a voltage source 12 and a capacitor 9 as loads.

Next, the operation of the above-mentioned first embodiment will be described. Referring to FIG. 2, the pairs of transistors 107 and 108; 101 and 102, respectively constituting the first and second coupling means D, E, have their emitters connected to the common current source 30 and operate as two sets of amplitude limiting amplifiers in which the balanced frequency-modulated signal sources 27, 28 and the bias voltage source 29 are connected between the bases of the respective pairs. Supposing that the dimensions of the emitters of the respective transistors 107 and 108; 101 and 102 are the same, collector currents of the transistors 107 and 101 and those of the transistors 108 and 102 present the same magnitudes. Between the bases, serving as control inputs, of the respective pairs of transistors 109 and 110; 111 and 112, 103 and 104; 105 and 106 constituting the first to fourth current dividing means F-I, a signal from the phase shift output terminal 7 of the phase shifting means 2 through the emitter follower formed by the transistor 19 is connected to one end thereof, while a direct current voltage at the alternate current ground terminal 8 of the phase shifting means 2 is connected to the other end thereof through the emitter follower formed by the transistor 21. The common emitters of the pairs of transistors 109 and 110, 111 and 112, which serve as inputs of the respective first and second current dividing means F, G, are connected to the collectors of the pair of transistors 107 and 108 which serves as outputs of the first coupling means D, while the collectors of the pairs of transistors 109 and 110; 111 and 112 are adapted to derive phase detecting outputs, in a manner similar to the coupling of the collectors of the pairs of transistors 109 and 110; 111 and 112 of the conventional apparatus shown in FIG. 1.

On the other hand, the common emitters of the pairs of transistors 103 and 104; 105 and 106, which serve as inputs of the third and fourth current dividing means H and I, respectively, are respectively connected to the collectors of the transistors 101 and 102 serving as the outputs of the second coupling means E. The collectors of the transistors 103 and 104, which are outputs of the third current dividing means H, and I are connected with each other so as to again mix divided currents and coupled to the phase shift input terminal 6 of the phase shifting means 2 to supply a frequency-modulated signal thereto. Similarly, the collectors of the transistors 105 and 106 are connected with each other and supplies the second voltage source 26 with a signal current through a resistor 32.

In the above first embodiment, changes in the magnitudes of angle modulation of signals generated from the frequency-modulated signal sources 27 and 28 cause corresponding changes in two sets of balanced amplitude-limited outputs generated from the amplitude limiting amplifiers respectively formed of the pairs of transistors 107 and 108; 101 and 102 which also constitute the first and second coupling means D and E, respectively. The respective balanced amplitude-limited outputs change completely in the same manner. Then, collector currents of the transistors 107 and 108 forming the first coupling means D are inputted to the common emitters of the pairs of transistors 109 and 110; 111 and 112, respectively, forming the first and second current dividing means which are constructed to derive phase detecting outputs. On the other hand, although collector currents of the transistors 101 and 102 are inputted to the common emitters of the pairs of transistors 103 and 104; 105 and 106 of the third and fourth current dividing means H and I, they are coupled to again mix divided currents, so that the output currents of the pairs of transistors 103 and 104; 105 and 106 are equal to the inputs thereof which are outputs of the amplitude limiting amplifier formed of the transistors 101 and 102. The output current of the third current dividing means H is supplied to the phase shifting input terminal 6 of the phase shifting means 2. Since the phase shifting means 2 adds a phase proportional to the amplitude of frequency modulation of a signal passing therethrough to its output signal, the phase of a signal at the phase shift output terminal 7 changes in proportion to the amplitude of frequency modulation of a signal supplied to the phase shift input terminal 6. Thus, a balanced amplitude-limited output in phase with a signal at the phase shift input terminal 6 is connected to the input, while a signal at the phase shift output terminal 7 is supplied to the control input through the emitter follower formed by the transistor 19, whereby balanced demodulated output currents proportion to the amplitude of frequency modulation of signals generated from the frequency-modulated signal sources 27 and 28 are derived at outputs of the pairs of transistors 109 and 110; 111 and 112, which respectively form first and second current dividing means F and G connected to derive phase detecting outputs.

A slight error of the phase caused by the emitter follower formed by the transistor 19, since its amount is fixed, can be readily corrected by the phase shifting means 2. One of the demodulated output currents is changed in its direction by current mirrors formed of the pairs of transistors 17 and 18; 13 and 14; 15 and 16, whereby a balanced demodulated signal current proportional to the amplitude of frequency modulation of the signals generated from the frequency-modulated signal sources 27 and 28 is finally derived at the demodulated signal output terminal 10 and further converted to a demodulated signal voltage by the resistor 11, the voltage source 12 and the capacitor 9.

Next, suppose that the amplitude of a signal supplied to the phase shift input terminal 6 of the phase shifting means 2 is made large, and driving current amplitudes of base-to-base voltages or control inputs of the pairs of transistors 109 and 110; 111 and 112; 103 and 104; 105 and 106, respectively forming the first-fourth current dividing means F-I, are also made large for the purpose of enhancing the demodulation sensitivity and reducing noise during demodulation. Then, the common emitters of the respective pairs are influenced by changes caused by the larger magnitudes of the base-to-base voltages to change the base-to-collector voltages of the pairs of transistors 107 and 108; 101 and 102 forming the first and second coupling means D and E. However, since these two pairs of transistors change completely in the same manner, such fluctuation in amount of change will not cause difference between the two sets of balanced amplitude-limited output currents. In other words, even if the amplitudes of signals generated by the frequency-modulated signal sources 27 and 28 fluctuate to cause fluctuations in amount of change in voltages at the common emitters due to the magnitudes of the base-to-base voltages, the two pairs of transistors are influenced completely in the same manner, so that relative phases of the derived two sets of balanced amplitude-limited outputs will not fluctuate.

According to the first embodiment as described above, the base-to-collector voltages of the respective pairs of transistors 107 and 108; 101 and 102 forming two sets of amplitude limiting amplifiers or the first and second coupling means D and E change completely in the same manner in response to changes possibly occurring in base-to-base voltages of the pairs of transistors 109 and 110; 111 and 112; 103 and 104; 105 and 106, the base-to-base voltages being the control inputs of the first—fourth voltage dividing means. Therefore, the balanced amplitude-controlled output voltages from the amplitude limiting amplifiers are completely the same, whereby no fluctuation due to fluctuations in amplitudes of signals generated by the frequency-modulated signal sources 27 and 28 will be present at a demodulated signal derived at the output terminal 10 of a quadrature detecting apparatus composed of the above-mentioned signals, the phase shifting means 2 and the phase detecting means (the first and second current dividing means F and G).

Figure 3:
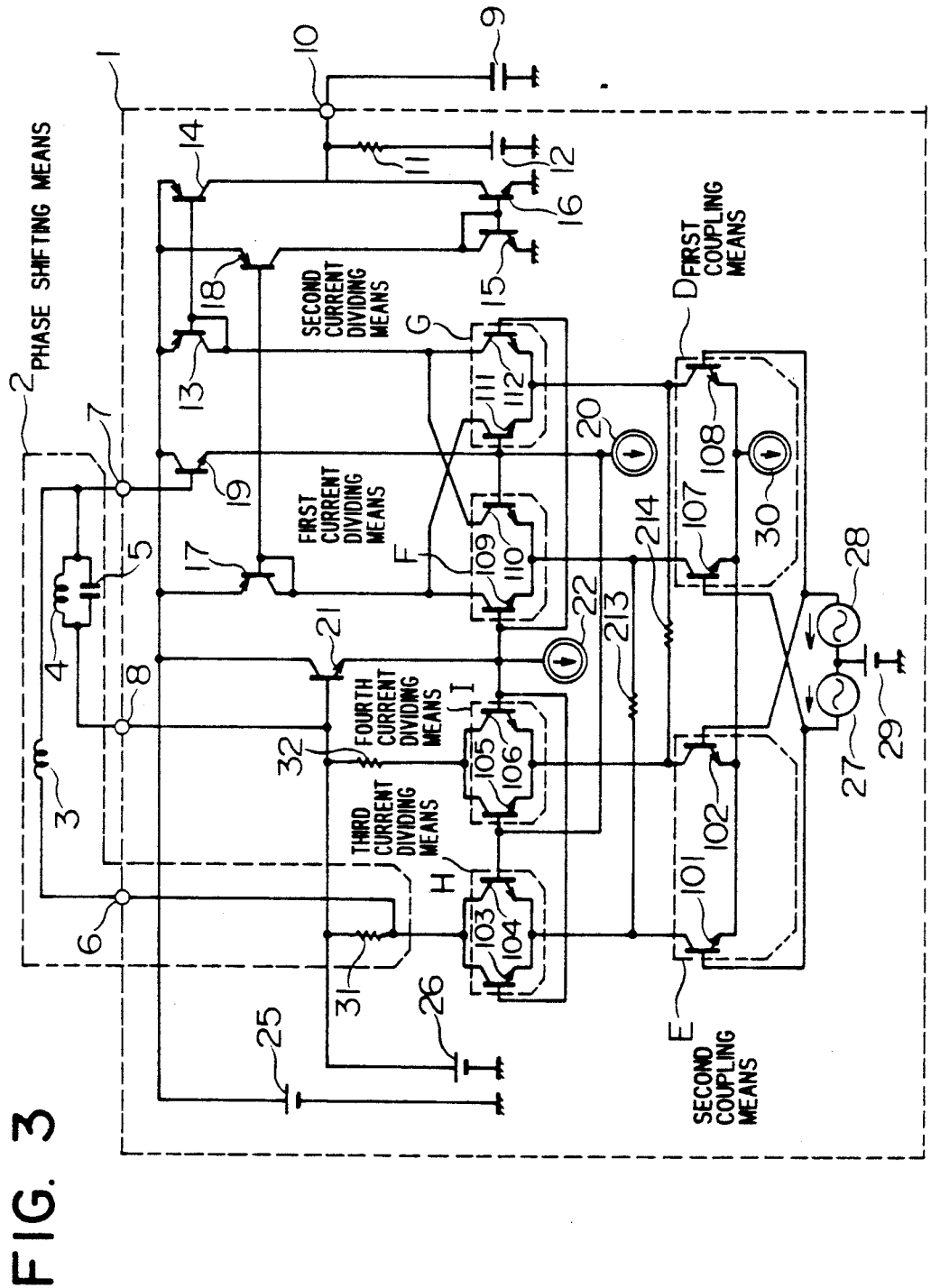
FIG. 3 is a schematic circuit diagram illustrating the configuration of the apparatus according to a second embodiment of the present invention.

FIG. 3 illustrates the configuration of a second embodiment. Between respective output terminals having the same polarity of two sets of amplitude limiting amplifiers which are equal to the first and second coupling means D and E of the first embodiment, that is, between the collectors of transistors 107 and 101 and between the collectors of transistors 108 and 102, resistors 213 and 214 are interposed to mutually feed currents when two sets of balanced amplitude-limited output currents are slightly different, thereby balancing both output currents to make them equal.

As described in connection with the first embodiment, since base-to-base voltages of respective pairs of transistors 109 and 110; 111 and 112; 103 and 104; 105 and 106 are the same, voltages at the respective common emitters should be the same. However, since the amplitudes and phases of collector voltages of the respective pairs are not the same, the voltages at the respective common emitters are slightly different from one another. By connecting the resistors 213 and 214 between this voltage difference, the equality of the two sets of balanced amplitude-limited output currents can be improved. In the second embodiment, therefore, fluctuations at the demodulated signal output terminal 10 caused by changes in amplitudes of signals generated by angle-modulated signal sources 27 and 28 are further reduced.

Figure 4:
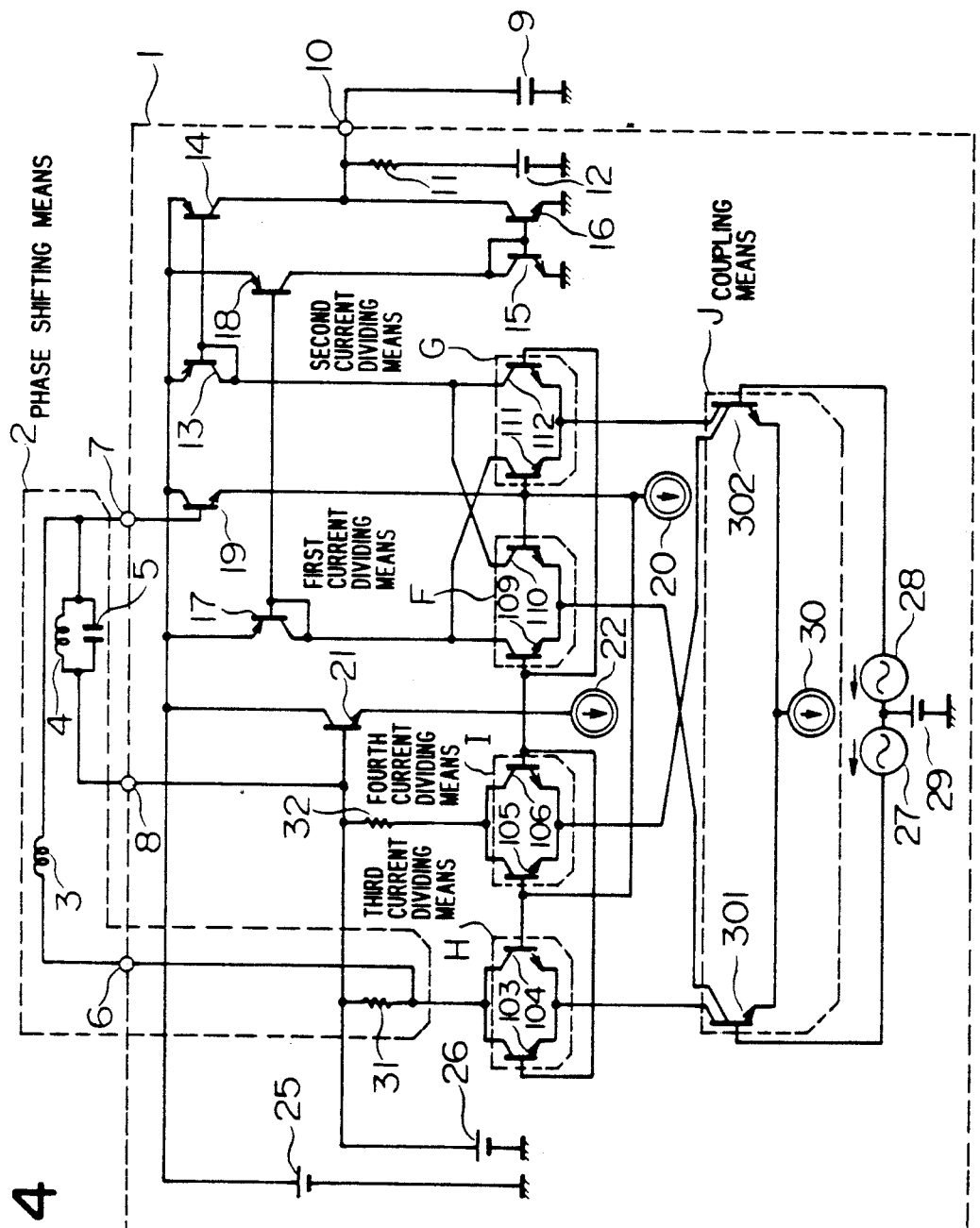
FIG. 4 is a schematic circuit diagram illustrating the configuration of a third embodiment of the present invention.

FIG. 4 illustrates the configuration of a third embodiment which has been made from the viewpoint that base voltages and emitter voltages of the transistors 107, 108, 101 and 102 forming the first and second coupling means D and E of the first embodiment shown in FIG. 2 are completely the same, and their collector voltages are also substantially the same. Specifically, a coupling means J having four outputs, equivalent to the above-mentioned transistors, is formed, for example, by a pair of multi-collector transistors 301 and 302 having divided collectors, each of which divides a current flowing into a single input into two in accordance with the magnitude of a control input and further divides the two current by a fixed division ratio. This configuration improves the equality of two sets of balanced amplitude-limited output currents as well as reduces the dimension of the semiconductor integrated circuit 1. Due to the circuit configuration in the semiconductor integrated circuit, unnecessary resistances inevitably exist between the collectors of the multi-collector transistors, which however correspond to the resistors 213 and 214 of the second embodiment shown in FIG. 3, so that no problem will arise if the values of the components are properly determined. The third embodiment thus produces the effect of reducing fluctuations in a demodulated signal derived at the demodulated signal output terminal 10 due to fluctuations in the amplitudes of signals generated from the angle-modulated signal sources 27 and 28 and reducing the dimension of the semiconductor circuit.

Figure 5:
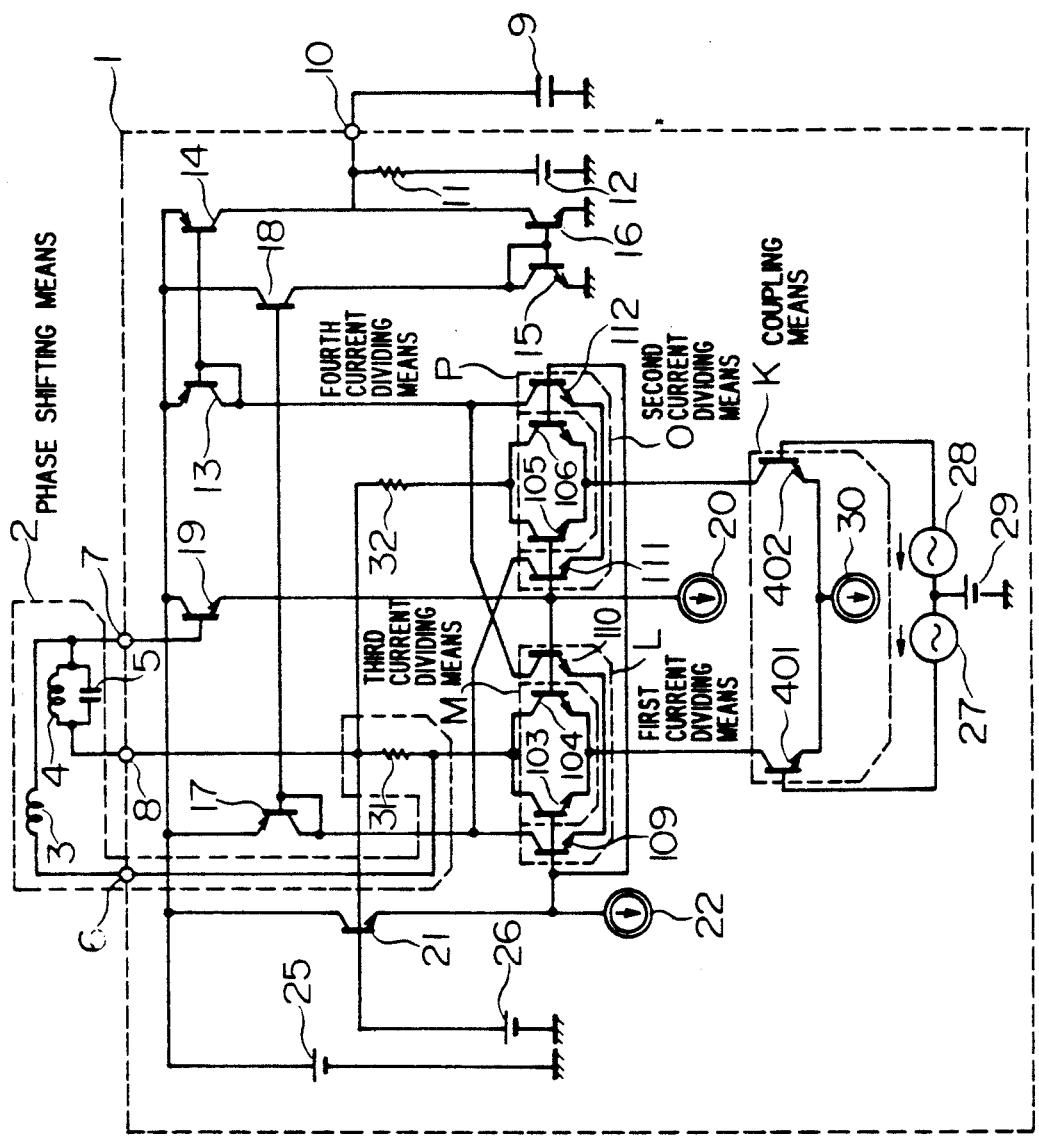
FIG. 5 is a schematic circuit diagram illustrating the configuration of a fourth embodiment of the present invention.

FIG. 5 illustrates the configuration of a fourth embodiment which has been made from the viewpoint that base voltages and emitter voltages of the transistors 107, 108, 101 and 102 forming the first and second coupling means D and E of the first embodiment shown in FIG. 2 are completely the same, and their collector voltages are also substantially the same. Specifically, these first and second coupling means are formed by a single coupling means K comprising a pair of transistors 401 and 402. One set of balanced amplitude-limited output currents, that is, outputs of the coupling means K are connected to common emitters of the transistors 109, 110, 103 and 104 forming inputs of first and third current dividing means L and M as well as common emitters of the transistors 111, 112, 105 and 106 forming inputs of second and fourth current dividing means 0 and P, thereby constituting a single amplitude limiting amplifier, where a balanced amplitude limited output current from the amplitude limiting amplifier is divided into two by an input of first, second, third and forth current dividing means, one of the divided currents is supplied to the outputs connected to the collectors thereof so as to obtain a phase detecting output, and the other divided current is supplied to a phase shifting means 2. This circuit configuration remarkably improves the equality of the two divided currents. It will therefore be understood that the fourth embodiment can suppress fluctuations in a demodulated signal derived at the demodulated signal output terminal 10 due to changes in amplitudes of signals generated from frequency-modulated signal sources 27 and 28 as well as reduce the dimension of a semiconductor integrated circuit 1.

Figure 6:
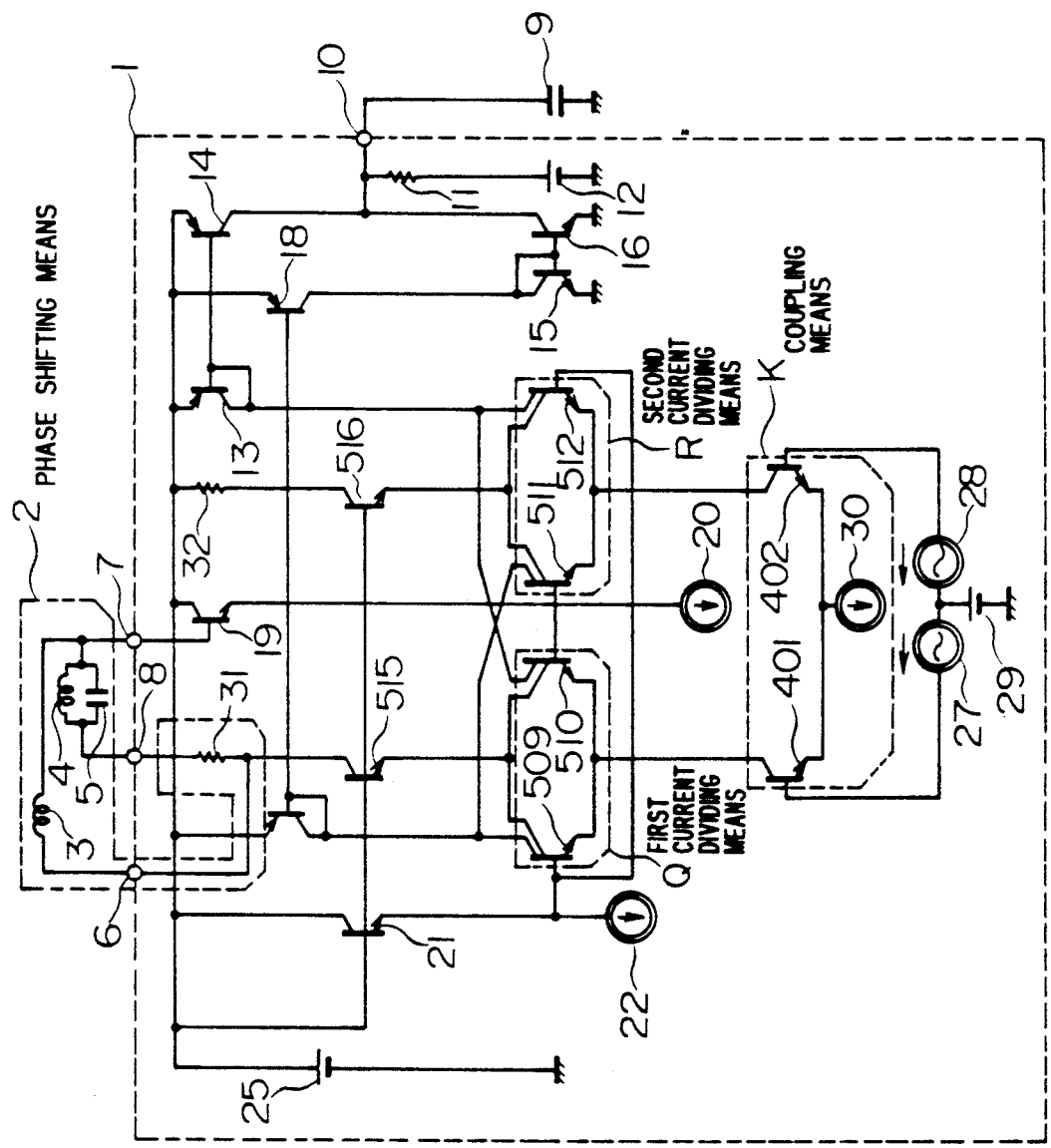
FIG. 6 is a schematic circuit diagram illustrating the configuration of a fifth embodiment of the present invention.

FIG. 6 illustrates the configuration of a fifth embodiment which has been made from the viewpoint that base voltages and emitter voltages of the transistors 109, 110, 103 and 104 forming the first and third coupling means L and M of the fourth embodiment shown in FIG. 5 are completely the same, and the base voltages and emitter voltages of the respective transistors 111, 112, 105 and 106 forming the second and fourth current dividing means 0 and P are also completely the same. In addition, for making the respective collector voltages substantially at the same voltage, first and second voltage sources 25 and 26 are set at the same voltage value, while common-base type transistors 515 and 516 are interposed in place of the resistors 31 and 32. Further additionally, the first, third, second and fourth current dividing means L, M, 0 and P shown in FIG. 5 are replaced by first and second current dividing means Q and R formed of, for example, pairs of collector-divided multi-collector transistors 509 and 510; 511 and 512, respectively, whereby a current flowing into a single input is divided into two in accordance with the magnitude of a control input, and these two divided currents are further divided by a fixed division ratio. This configuration can further reduce the dimension of the semiconductor integrated circuit 1 compared with the fourth embodiment. It will therefore be understood that the fifth embodiment can suppress fluctuations of a demodulated signal derived at the demodulated signal output terminal 10 due to changes in the amplitudes of the signals generated from angle-modulated signal sources 27 and 28 as well as reduce the dimension of the semiconductor integrated circuit 1.

Incidentally, the method of making equal voltages at the output terminals of the third, fourth, first and second current dividing means, that is, base-to-collector voltages of the respective transistors by setting voltage values of the first and second voltage sources 25 and 26 at the same value or inserting common-base type transistors between outputs of the third and fourth current dividing means M, P and the resistances 31, 32 can be similarly applied to the first, second, third and fourth embodiments, and similar effects can be produced.

Further, in place of the current source 30 commonly connected to the inputs of the first and second coupling means D and E of the first and second embodiments, an individual current source may be connected to each of the inputs, thereby producing similar effects.

Also in the first—fifth embodiments, the fourth current dividing means I and P and the resistor 32 may be removed if a primary purpose of these embodiments is to reduce the dimension of the semiconductor integrated circuit while a secondary purpose is to suppress fluctuations due to changes in amplitude of a demodulated signal derived at the demodulated signal output terminal 10 due to changes in amplitudes of signals generated from angle-modulated signal sources.

Furthermore, although in the first - fifth embodiments, the phase shifting means 2 is of the unbalanced type, a complete balanced-type quadrature detecting apparatus can be constituted by newly providing a balanced-type phase shifting means and supplying a frequency-modulated signal from a connecting point of the output of the fourth current dividing means I or P and the resistor 32 to an additional phase shifting input terminal. Similar effects can also be produced by this configuration.

Also in the first - fifth embodiments, the phase shifting relationship between input and output of the phase shifting means 2 only depends on frequency-modulated signals, however, if the phase shifting means 2 is active one having another control input, similar effects can be produced.

As described above, the configurations shown in the first to fifth embodiments produce the following effects:

(1) According to the first and second embodiments, one of two sets of amplitude limited outputs which are generated by making completely the same voltages at respective terminals of two sets of coupling means, that is, amplitude limiting amplifiers or by dividing the output of a single coupling means or amplitude limiting amplifier into two is used as an input to the phase detecting means, while the other one is used as a control input therefor through the phase shifting means, whereby both signals exhibit good equality, and fluctuations due to changes possibly occurring in amplitudes of signals generated from frequency-modulated signal sources will not be present in a demodulated signal derived at the demodulated signal output terminal.

(2) According to the third embodiment, since two sets of coupling means or amplitude limiting amplifiers are replaced by a single four-output coupling means or amplitude limiting amplifier, the equality of two sets of amplitude limited outputs is improved, thereby making it possible to suppress fluctuations in a demodulated signal derived at the demodulated signal output terminal due to changes in amplitudes of signals generated from frequency-modulated signal sources as well as reduce the dimension of the semiconductor integrated circuit.

(3) According to the fourth embodiment, since two sets of coupling means or amplitude limiting amplifiers are replaced by a single coupling means or amplitude limiting amplifier to divide an output current into two, the resultant two amplitude limited outputs exhibit good equality, thereby making it possible to suppress fluctuations in a demodulated signal derived at the demodulated signal output terminal due to changes in amplitudes of signals generated from frequency-modulated signal sources as well as reduce the dimension of the semiconductor integrated circuit.

(4) According to the fifth embodiment, since two sets of coupling means or amplitude limiting amplifiers are replaced by a single coupling means or amplitude limiting amplifier to divide an output current into two, and further the first and third current dividing means and the second and fourth current dividing means respectively for generating a phase detecting output and for generating a re-mixed output are formed of two sets of four-output current dividing means, two sets of amplitude limited outputs present good equality, thereby making it possible to suppress fluctuations in a demodulated signal derived at the demodulated signal output terminal due to changes in the amplitudes of signals generated from frequency-modulated signal sources as well as reduce the dimension of the semiconductor integrated circuit.

Also, the pairs of common emitter transistors in the foregoing first—fifth embodiments may be replaced by pairs of common source field effect transistors, while the pairs of multi-collector transistors by pairs of multi-drain field effect transistors.

As is apparent from the above described embodiments, the present invention produces the following effects:

(1) The outputs of the respective two coupling means are connected to two current dividing means which are driven by the same signal, so that the respective input and output terminals are at the same voltage level. For this reason, even if the amplitudes of frequency-modulated signals inputted to the coupling means fluctuate, the two outputs of the current dividing means are the same, thereby producing an effect of preventing such fluctuations from appearing in a demodulated output.

(2) The outputs of the coupling means, since connected to two current dividing means which are driven by the same signal, present the same voltage. Therefore, since two divided outputs are the same even if the amplitudes of frequency-modulated signals supplied to the respective coupling means fluctuate, such fluctuations will not appear in a demodulated output.

(3) The outputs of the coupling means, since connected to two current dividing means which are driven by the same amplitude signal, present the same voltage. In this configuration, two output currents, since divided in a fixed division ratio, remain fixed even if the amplitudes of frequency-modulated signals supplied to the coupling means fluctuate, whereby such fluctuations will not appear in a demodulated output.

(4) The outputs of the coupling means are connected to the current dividing means driven by the same signal, and a phase detecting output and a re-mixed output are derived by a signal divided and further divided by the current dividing means. Therefore, the two outputs further divided by the current dividing means are the same even if the amplitudes of frequency-modulated signals supplied to the coupling means fluctuate, whereby such fluctuations will not appear in a demodulated output.

I claim:

1. An angle modulation detector comprising:
   first and second coupling means coupled to receive balanced angle-modulated signals;
   first and second current dividing means coupled to receive the output of said first coupling means for outputting a phase detecting output;
   third and fourth current dividing means coupled to receive the output of said second coupling means for outputting a re-mixed output; and
   phase shifting means coupled to receive the re-mixed outputs which are outputted from said third and fourth current dividing means for adding a phase in response to an angle-modulating signal input,
   wherein the output of said phase shifting means is inputted to control inputs of said respective first, second, third and fourth current dividing means, and the phase detecting outputs of said first and second current dividing means is used as a detecting output.

2. An angle modulation detector according to claim 1, wherein said first, second, third and fourth current dividing means are formed of pairs of transistors having emitters or sources connected in common.

3. An angle modulation detector according to claim 1, wherein resistors are interposed between the inputs of said first and second current dividing means.

4. An angle modulation detector comprising:
   coupling means coupled to receive balanced angle-modulated signals for outputting first and second outputs;

first and second current dividing means coupled to receive the first output of said coupling means for outputting a phase detecting output;

third and fourth current dividing means coupled to receive the second output of said coupling means for outputting a re-mixed output; and phase shifting means coupled to receive the re-mixed outputs which are outputted from said third and fourth current dividing means for adding a phase in response to an angle-modulated signal input, wherein the output of said phase shifting means is inputted to control inputs of said respective first, second third and fourth current dividing means, and the phase detecting outputs of said first and second current dividing means is used as a detecting output.

5. An angle modulation detector according to claim 4, wherein said coupling means is formed of a pair of multi-collector or multi-drain transistors.

6. An angle modulation detector according to claim 4, wherein said first, second, third and fourth current dividing means are formed of pairs of transistors having emitters or sources connected in common.

7. An angle modulation detector comprising:

coupling means coupled to receive balanced angle-modulated signals;

first and second current dividing means coupled to receive the output of said coupling means for outputting a phase detecting output;

third and fourth current dividing means coupled to receive the output of said coupling means for outputting a re-mixed output; and phase shifting means coupled to receive the re-mixed outputs which are outputted from said third and fourth current dividing means for adding a phase in response to an angle-modulated signal input.

8. An angle modulation detector according to claim 7, wherein said first, second, third and fourth current dividing means are formed of pairs of transistors having emitters or sources connected in common.

9. An angle modulation detector comprising:

coupling means coupled to receive balanced angle-modulated signals;

current dividing means coupled to receive the output of said coupling means for outputting a phase detecting output and a re-mixed output respectively; and phase shifting means coupled to receive the re-mixed output of said current dividing means for adding a phase in response to an angular-modulated signal input, wherein the output of said phase shifting means is inputted to a control input of said current dividing means, and the phase detecting output of said current dividing means is used as a detecting output.

10. An angle modulation detector according to claim 9, wherein said each current dividing means is formed of a pair of multi-collector or multi-drain transistors.

11. An angle modulation detector according to claim 9, wherein said current dividing means is formed of pairs of transistors having emitters or sources connected in common.

* * * * *